April 18, 1961 R. A. HILBOURNE 2,980,865
STABILIZED TRANSISTOR OSCILLATOR
Filed March 30, 1959
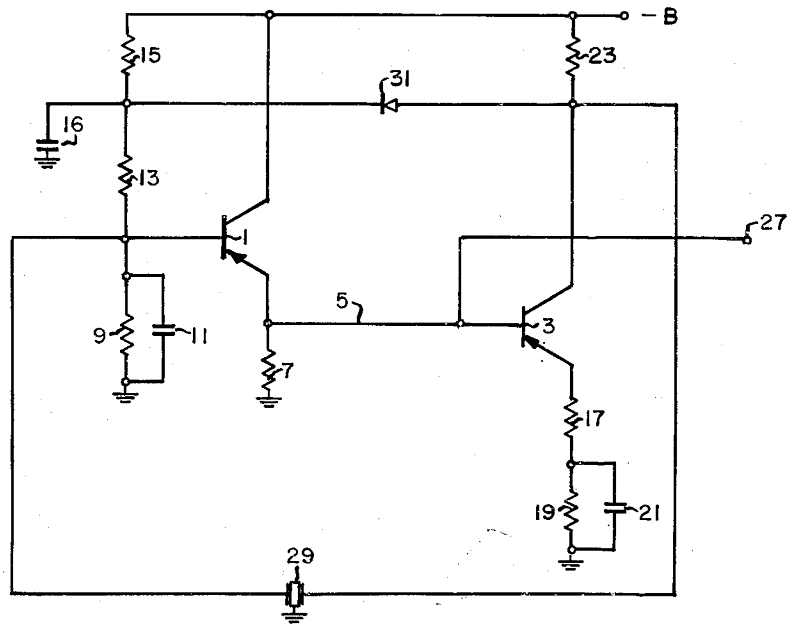

United States Patent Office 2,980,865

Patented Apr. 18, 1961

2,980,865

STABILIZED TRANSISTOR OSCILLATOR

Robert Arthur Hilbourne, London, England, assignor to Hazeltine Research, Inc., Chicago, Ill., a corporation of Illinois Filed Mar. 30, 1959, Ser. No. 802,781

Claims priority, application Great Britain Apr. 14, 1958

7 Claims. (Cl. 331—116)

This invention relates to oscillator circuits incorporating junction transistors, and particularly to such a circuit wherein the wave form and frequency of the oscillatory output signal is stabilized against variations in the characteristics of the active elements of the circuit.

A transistor oscillator may be constructed by connecting a bimorph piezoelectric crystal in a regenerative feedback path between the output and input terminals of a cascade transistor amplifier. If the input and output impedances of the amplifier are low enough so the Q of the complete feedback loop is not appreciably less than that of the crystal itself, and if the phase shift around the loop is substantially zero, oscillation will occur, and a substantially sinusoidal signal at the resonant frequency of the crystal will be generated. The requisite phase shift may be established by constructing the amplifier to have a net phase shift of 180°, the bimorph crystal itself providing an additional 180° shift. As is well known, a bimorph crystal actually comprises two individual crystals cemented together in such a way that a positive change in potential across one results in a negative change in potential across the other. In operation, the output signal will build up to a value limited to that at which it causes the last transistor in the cascade amplifier to cut off during alternate half cycles. The high frequency selectivity of the crystal allows substantially only the single sinusoidal oscillatory frequency component of the distorted wave so produced at the amplifier output terminals to return through the feedback loop to the amplifier input terminals, so that the desired output signal may be obtained at the input terminals of the last transistor.

The signal gain around the feedback loop depends on the current gain factors of the transistors and the signal attenuation introduced by the crystal, and must have a value of at least unity in order to sustain oscillation. A serious problem in this respect is that the crystal attenuation varies from crystal to crystal of nominally similar type, the same also being true of the current gain factors of different transistors of nominally similar type. It is therefore necessary to choose the various circuit components to obtain a loop gain which is just greater than unity when the crystal attenuation is a maximum and the transistor current gain factors are a minimum for the nominal types of crystal and transistors to be employed. When this is done, however, it often develops that when a crystal producing relatively low attenuation and/or transistors having relatively high current gain factors are employed, the loop gain becomes high enough to drive the last transistor to saturation during the half cycles alternate to those during which it is driven to cut off. Since the input impedance of a saturated transistor is quite low, the wave form of the generated output signal is then severely distorted by peak clipping on alternate half cycles.

Accordingly, an object of the present invention is to provide a junction transistor oscillator which produces a sinusoidal output signal of stable frequency and which is substantially free from distortion despite variations in the characteristics of the active elements of the oscillator circuit.

Pursuant to the foregoing object, a junction transistor oscillator in accordance with the invention comprises a plurality of junction transistors connected in cascade to form an amplifier having a phase shift of substantially 180° and a signal gain dependent on the transistor current gain factors. The oscillator further comprises a bimorph piezoelectric crystal connected between the input and output terminals of the amplifier for establishing a regenerative feedback loop, the signal gain around the feedback loop being adequate to cause an oscillatory sinusoidal signal voltage to be generated therein substantially at the resonant frequency of the crystal. The oscillator additionally comprises voltage limiting means connected to the output terminals of the amplifier, such means being adapted to prevent the voltage across those terminals from falling below a substantially constant level exceeding that corresponding to saturation of any of the transistors. Accordingly, the wave form of the signal voltage across the input terminals of the last transistor in the amplifier remains sinusoidal at the foregoing resonant frequency in spite of variations in the current gain factors of any of the transistors and in the signal attenuation caused by the crystal.

For a better understanding of the invention, together with other and further objects thereof, reference may be had to the accompanying circuit drawing of a particular preferred embodiment thereof. Note, however, that the actual scope of the invention is pointed out in the appended claims.

Referring to the drawing, the illustrated embodiment of the invention includes a pair of PNP junction transistors 1 and 3 each having a pair of input terminals and a pair of output terminals together with means such as conductor 5 and a common ground connection for connecting the output terminals of transistor 1 to the input terminals of transistor 3 so as to form a cascade amplifier. The over-all phase shift through the amplifier so formed is established at substantially 180°, which can be accomplished by connecting transistor 1 in a grounded or common collector circuit arrangement and transistor 3 in a grounded or common emitter circuit arrangement. Accordingly, a signal at the base of transistor 1, serving as the amplifier input terminal, will result in an amplified signal at the collector of transistor 3, serving as the amplifier output terminal, with respect to ground in each case. More specifically, the foregoing circuit arrangements may be effected, as illustrated, by connecting the collector of transistor 1 to the negative terminal of a stabilized constant voltage source B which is grounded at its positive terminal. The collector is thus placed substantially at "signal" ground potential. The emitter of transistor 1 is connected to ground via a resistor 7, while the base is grounded via a resistor 9 shunted by a small capacitor 11 for a reason described hereinafter. The requisite emitter-to-base bias is established by also connecting the base to the negative terminal of source B by a pair of resistors 13 and 15 in series, resistor 15 being bypassed to ground by a capacitor 16.

The grounded emitter circuit arrangement of transistor 3 may be effected, as shown, by connecting the emitter thereof to ground via a pair of resistors 17 and 19 in series, the latter resistor being bypassed with respect to signal currents by a capacitor 21. Resistor 17 establishes some degree of negative feedback for stabilizing the signal gain of transistor 3 somewhat against variations in the current gain factor $\alpha$, while resistors 17 and 19 together serve to effect stabilization against temperature variation in a manner well known in the art. The collector of transistor 3 is connected to the negative terminal of voltage source B by means of a resistor 23, resistors 17 and 23 serving together as the output load for transistor 3. Appropriate base bias voltage is established by the emitter bias voltage of transistor 1 in view of the direct connection effected by conductor 5, a ground reference level at the base of transistor 3 being established by resistor 7.

With the foregoing arrangement, an input signal voltage at the amplifier input terminals, between the base of transistor 1 and ground, will appear at the emitter without any change in phase and slightly reduced in amplitude. By means of conductor 5, or equivalent signal translating means which may actually comprise additional cascaded transistors to achieve additional signal gain, the foregoing signal will result in application of a signal voltage at the base of transistor 3 and so between its base and emitter input terminals. Transistor 3 will amplify this signal to a degree dependent on its current gain factor, producing an amplified signal between its collector-to-ground output terminals with a shift in phase of substantially 180°. The over-all gain of the cascade amplifier is therefore dependent on the current gain factors of all the transistors which may be employed.

It will be noted that grounded collector transistor 1 is not used to provide signal gain or phase shift. Instead, its function is to match the relatively low input impedance of the ensuing grounded emitter transistor 3 to the high output impedance of the feedback crystal 29 described hereinafter. If transistor 3 were used alone, its low impedance would require such a high signal gain from the amplifier that little or no negative feedback could be used. The use of negative feedback in the amplifier is, of course, desirable since it reduces variation of the signal gain with variation of the current gain factors ($\alpha$) of the transistors which are employed. It should further be noted that although transistors 1 and 3 have been assumed to be type PNP, each may be type NPN or they may even be of opposite type conductivity so long as the appropriate supply voltage polarities are provided in accordance with the usual principles of correct transistor biasing.

In order to form a complete oscillator, a bimorph piezoelectric crystal 29 is connected between the output and input terminals of the cascade amplifier to establish a regenerative feedback loop. This loop will thus be between the output terminals of transistor 3 and the input terminals of transistor 1. In the specific arrangement illustrated, such connection is effected by connecting one terminal of crystal 29 to the collector of transistors 3 and the other terminal to the base of transistor 1, the common terminal of crystal 29 being grounded. Since the phase shift through a bimorph crystal is substantially 180°, the total phase shift around the feedback loop so established is substantially 0°. Accordingly, so long as the signal gain around the loop exceeds unity, oscillations will occur and an oscillatory signal voltage will be generated therein. This will result in a signal at load terminal 27 across the emitter-to-ground input terminals of transistor 3. In addition, by choosing the values of the various circuit elements associated with transistors 1 and 3 so as to obtain amplifier input and output impedances which are low enough so the Q of the feedback loop is not appreciably lower than the Q of crystal 29 itself, the foregoing oscillations will be sinusoidal and substantially at the resonant frequency of the crystal. Of course, this condition can only be approached as closely as permitted by the requirement that the over-all gain of the amplifier be sufficient to provide a net loop gain greater than unity, the latter being governed by the current gain factors of the transistors and the signal attenuation caused by crystal 29. As stated above, the circuit is constructed so that with a crystal giving maximum attenuation for the type employed and transistors having minimum current factors for the types employed, the over-all loop gain just exceeds unity.

In operation of the illustrated circuit, oscillation builds up until the amplitude of the signal voltage at the collector of transistor 3 causes it to cut off during alternate half cycles. As a result of this limiting action, the negative peaks of the collector voltage wave form of transistor 3 are clipped, causing serious distortion. However, due to the high Q of crystal 29 only the oscillatory frequency sinusoidal component of this voltage is fed back to the base of transistor 1 and so only that component appears in the signal obtained at load terminal 27. In addition, even though the input impedance of transistor 3 rises to a very high value when it reaches the cutoff state, since it is shunted by the low effective impedance at the emitter of transistor 1, it has little effect on the wave form of the signal supplied to a load. In this connection, it may be noted that bimorph crystals are found to have a second mode of oscillation at a higher frequency than their primary resonant frequency. Capacitor 11 connected between the base of transistor 1 and ground serves to reduce the loop gain at this higher frequency and so to prevent oscillation thereat.

A major difficulty in actually constructing the oscillator circuit to operate as described arises when the crystal employed has a relatively low attenuation and/or the transistor current gain factors are relatively high even though the crystal and the transistors are of the nominal types specified by the circuit designer. The net gain around the feedback loop may then become high enough so that during positive half cycles of the oscillatory voltage at the collector of transistor 3 the net collector voltage drops (i.e., becomes less negative) to a level at which the transistor saturates. Its input impedance would then become very low, and this impedance drop would be reflected back across the input terminals of the amplifier and therefore cause serious distortion of the wave form of the signal voltage at load terminal 27. It will be appreciated that, for the same reason given above the reference to negative peak clipping, the positive peak clipping of the collector voltage of transistor 3 would not of itself cause appreciable distortion of the signal voltage wave form at terminal 27.

In order to reduce the likelihood of transistor 3 saturating, the values of resistors 17 and 23 across the output terminals thereof, and which together form the output load for that transistor, are chosen so the direct bias voltage across them is less than the direct bias voltage between the collector and emitter. This means that the collector will be at an operating point which places transistor 3 closer to cutoff than to saturation. Thus, the likelihood of saturation is reduced at the expense of increased likelihood of cutoff. As explained above, this is advantageous in view of the fact that cutoff of transistor 3 does not distort the wave form of the signal at terminal 27. In spite of this technique, however, it has been found that saturation of transistor 3 may still occur in the extreme case wherein crystal 29 has low attenuation and transistors 1 and 3 have high current gain factors. In accordance with the invention, transistor saturation is prevented by connecting voltage limiting means to the output terminals of the cascade amplifier, such voltage limiting means being adapted to prevent the voltage thereacross from falling below a substantially constant predetermined level exceeding that corresponding to saturation of any of the transistors. Such voltage limiting means may be designed so that it remains non-conductive until the voltage across the amplifier output terminals falls to a level exceeding that corresponding to saturation of transistor 3, and then conducts to prevent it from falling below such a level. As shown in the illustrated circuit embodiment, such voltage limiting means may simply comprise a rectifier 31 connected in series between one of the amplifier output terminals, in this case the collector of transistor 3, and a point of substantially constant potential. Since the collector voltage of transistor 3 drops from a more negative to a less negative level as it approaches saturation, constituting a positive voltage change, rectifier 31 is poled to conduct current in a direction away from the collector. This rectifier is preferably a P-N junction silicon crystal. The point of constant potential to which it is connected should be slightly more negative than the saturation level of the collector voltage of transistor 3. Such a potential is made available at the junction of resistors 13 and 15 connected to the base input terminal of transistor 1, the values of those resistors together with that of resistor 19 being selected to provide the requisite potential for rectifier 31 in addition to establishing a suitable base bias voltage for transistor 1.

In operation, rectifier 31 will begin to conduct when the collector current of transistor 3 rises to a value just below that which would be obtained if saturation occurred. The collector voltage therefore cannot fall to the value corresponding to saturation. In addition, the current through rectifier 31 returns to the negative terminal of voltage supply B through resistor 15, thus reducing the forward base bias voltage of transistor 1. This, in turn, reduces the bias voltage across emitter resistor 7. Since the latter is connected to the base of transistor 3, the forward bias of that transistor and the collector current thereof drop. The resultant reduction in the current gain factor of transistor 3 reduces the net loop gain and so serves to reduce the signal voltage amplitude at the collector of transistor 3. Accordingly, besides positively preventing transistor 3 from saturating, rectifier 31 also tends to prevent saturation by controlling the loop gain of the oscillator in a manner similar to that of an automatic-gain-control diode in a radio or television receiver.

While a wide variety of types of crystals and transistors and of the values of the various associated circuit elements may be employed, the illustrated embodiment of the invention was constructed and successfully operated using the following components:

| | |
|---|---|
| Voltage source B | 9 volts. |
| Transistors 1 and 3 | The General Electric Co. Ltd. of England, Type GET 3. |
| Rectifier 31 | The General Electric Co. Ltd. of England, Type SX 641. |
| Crystal 29 | Salford Electrical Instruments Ltd.,, Type DJC bimorph unit resonant at 1,000 cycles per second. |
| Capacitor 11 | 680 micromicrofarads. |
| Capacitor 16 | 8 microfarads. |
| Capacitor 21 | 50 microfarads. |

| Resistors: | Ohms |
|---|---|
| 7 | 10,000 |
| 9 | 47,000 |
| 13 | 47,000 |
| 15 | 100,000 |
| 17 | 1,000 |
| 19 | 4,700 |
| 23 | 8,200 |

With the foregoing circuit values, the generated signal voltage wave form at terminal 27 had a second harmonic content between 0.2% and 0.3%, and a third harmonic content of approximately 0.1%. With rectifier 31 omitted the corresponding figures were 3% and 2%, respectively. The frequency stability in relation to temperature variation was found to be substantially dependent on the temperature/frequency characteristic of crystal 29. With regard to the degree of stabilization required of voltage source B, variation of the magnitude of the supplied voltage between 3 and 18 volts was found to be permissible without causing the circuit to stop oscillating. The same voltage variation produced a change in oscillation frequency of only five parts in $10^5$.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A junction transistor oscillator comprising: a plurality of junction transistors connected in cascade to form an amplifier having a phase shift of substantially 180° and a signal gain dependent on the transistor current gain factors; a bimorph piezoelectric crystal connected between the input and output terminals of said amplifier for establishing a regenerative feedback loop, the signal gain around said feedback loop being adequate to cause as oscillatory sinusoidal signal voltage to be generated therein substantially at the resonant frequency of said crystal; and voltage limiting means connected to the output terminals of said amplifier, said voltage limiting means being adapted to remain nonconductive until the voltage thereacross falls to a substantially constant predetermined level exceeding that corresponding to saturation of any of said transistors and then conducts to prevent that voltage from falling below said predetermined level so as to prevent them from saturating; whereby the wave form of the signal voltage across the input terminals of the last transistor in said amplifier remains sinusoidal at said resonant frequency in spite of variations in the current gain factors of any of said transistors and in the signal attenuation caused by said crystal.

2. A junction transistor oscillator comprising: a plurality of junction transistors connected in cascade to form an amplifier having a phase shift of substantially 180° and a signal gain dependent on the transistor current gain factors; a bimorph piezoelectric crystal connected between the input and output terminals of said amplifier for establishing a regenerative feedback loop, the signal gain around said feedback loop being adequate to cause an oscillatory sinusoidal signal voltage to be generated therein substantially at the resonant frequency of said crystal; and a rectifier connected between a point of substantially constant potential and one of the output terminals of said amplifier, the polarity of said rectifier and the value of said potential being such that the rectifier remains nonconductive until the voltage across said output terminals drops to a predetermined level exceeding that corresponding to saturation of any of said transistors and then conducts to prevent that voltage from falling below said predetermined level so as to prevent them from saturating; whereby the wave form of the signal voltage across the input terminals of the last transistor in said amplifier remains sinusoidal at said resonant frequency in spite of variations in the current gain factors of any of said transistors and in the signal attenuation caused by said crystal.

3. A junction transistor oscillator comprising: a plurality of junction transistors connected in cascade to form an amplifier having a phase shift of substantially 180° and a signal gain dependent on the transistor current gain factors; a bimorph piezoelectric crystal connected between the input and output terminals of said amplifier for establishing a regenerative feedback loop, the signal gain around said feedback loop being adequate to cause an oscillatory sinusoidal signal voltage to be generated therein substantially at the resonant frequency of said crystal; and a rectifier connected between one of the output terminals of said amplifier and a point of substantially constant potential connected to one of the input terminals thereof, the polarity of said rectifier and the value of said potential being such that the rectifier remains nonconductive until the voltage across said output terminals drops to a predetermined level exceeding that corresponding to saturation of any of said transistors and then conducts to prevent that voltage from falling below said predetermined level so as to prevent them from saturating, the conduction of said rectifier serving to change the voltage across the input terminals of said amplifier so as to reduce the signal gain thereof; whereby the wave form of the signal voltage across the input terminals of the last transistor in said amplifier remains sinusoidal at said constant frequency in spite of variations in the current gain factors of any of said transistors and in the signal attenuation caused by said crystal.

4. A junction transistor oscillator comprising: a first junction transistor having an emitter, a base, and a collector connected in grounded collector circuit arrangement; a second junction transistor having an emitter, a base, and a collector connected in grounded emitter circuit arrangement; signal translating means for coupling the emitter of said first transistor to the base of said second transistor to form a cascade amplifier between the base of said first transistor and the collector of said second transistor with respect to ground, the over-all phase shift through said amplifier being substantially 180° and the signal gain thereof being dependent on the current gain factors of said transistors and the signal translation effected by said translating means; a bimorph piezoelectric crystal connected between the collector of said second transistor and the base of said first transistor for establishing a regenerative feedback loop, the signal gain around said feedback loop and the Q thereof in relation to the resonant frequency Q of said crystal being adequate to cause an oscillatory sinusoidal signal voltage to be generated substantially at said resonant frequency at the base of said second transistor; and voltage limiting means connected to the collector of said second transistor, said voltage limiting means being adapted to remain nonconductive until the collector voltage falls to a substantially constant predetermined level exceeding that corresponding to saturation of said second transistor and then conducts to prevent that potential from falling below said predetermined level so as to prevent saturation of either of said transistors; whereby the wave form of said generated signal remains sinusoidal at said resonant frequency in spite of variations in the current gain factors of said transistors and in the signal attenuation caused by said crystal.

5. A junction transistor oscillator comprising: a first junction transistor having an emitter, a base, and a collector connected in grounded collector circuit arrangement; a second junction transistor having an emitter, a base, and a collector connected in grounded emitter circuit arrangement; signal translating means for coupling the emitter of said first transistor to the base of said second transistor to form a cascade amplifier between the base of said first transistor and the collector of said second transistor with respect to ground, the over-all phase shift through said amplifier being substantially 180° and the signal gain thereof being dependent on the current gain factors of said transistors and the signal translation effected by said translating means; a bimorph piezoelectric crystal connected between the collector of said second transistor and the base of said first transistor for establishing a regenerative feedback loop, the signal gain around said feedback loop and the Q thereof in relation to the resonant frequency Q of said crystal being adequate to cause an oscillatory sinusoidal signal voltage to be generated substantially at said resonant frequency at the base of said second transistor; and a rectifier connected between a point of substantially constant potential and the collector of said second transistor, the polarity of said rectifier and the value of said potential being such that the rectifier remains nonconductive until the collector voltage of said second transistor falls to a predetermined level exceeding that corresponding to saturation of said second transistor and then conducts to prevent that potential from falling below said predetermined level so as to prevent saturation of either of said transistors; whereby the wave form of said generated signal remains sinusoidal at said resonant frequency in spite of variations in the current gain factors of said transistors and in the signal attenuation caused by said crystal.

6. A junction transistor oscillator comprising: a first junction transistor having an emitter, a base, and a collector connected in grounded collector circuit arrangement; a second junction transistor having an emitter, a base, and a collector connected in grounded emitter circuit arrangement; signal translating means for coupling the emitter of said first transistor to the base of said second transistor to form a cascade amplifier between the base of said first transistor and the collector of said second transistor with respect to ground, the over-all phase shift through said amplifier being substantially 180° and the signal gain thereof being dependent on the current gain factors of said transistors and the signal translation effected by said translating means; a bimorph piezoelectric crystal connected between the collector of said second transistor and the base of said first transistor for establishing a regenerative feedback loop, the signal gain around said feedback loop and the Q thereof in relation to the resonant frequency Q of said crystal being adequate to cause an oscillatory sinusoidal signal voltage to be generated substantially at said resonant frequency at the base of said second transistor; and a rectifier connected between the collector of said second transistor and a point of substantially constant potential connected to the base of said first transistor, the polarity of said rectifier and the value of said potential being such that the rectifier remains nonconductive until the collector voltage of said second transistor falls to a predetermined level exceeding that corresponding to saturation of said second transistor and then conducts to prevent that voltage from falling below said level so as to prevent saturation of either of said transistors, the conduction of said rectifier serving to change the voltage across the base and emitter of said first transistor so as to reduce the signal gain of said amplifier; whereby the wave form of said generated signal remains sinusoidal at said resonant frequency in spite of variations in the current gain factors of said transistors and in the signal attenuation caused by said crystal.

7. A junction transistor oscillator comprising: a junction transistor amplifier arranged to provide a phase shift of substantially 180° between its input and output; a bimorph piezoelectric crystal connected in a regenerative feedback path between the output and input of said transistor amplifier, the input and output impedances of said amplifier being sufficiently low so that the Q of said feedback path is not appreciably less than that of said crystal; and means connected to said amplifier adapted to remain nonconductive until either of said transistors approaches saturation and to then become conductive so as to prevent saturation from occurring; whereby the wave form of the oscillatory signal which is produced remains sinusoidal in spite of variations in the current gain factors of any of said transistors and in the signal attenuation caused by said crystal.

References Cited in the file of this patent

UNITED STATES PATENTS

| | | |
|---|---|---|
| 2,444,349 | Harrison | June 29, 1948 |

FOREIGN PATENTS

| | | |
|---|---|---|
| 792,418 | Great Britain | Mar. 26, 1958 |
| 801,455 | Great Britain | Sept. 17, 1958 |